(12) United States Patent  
Chang

(10) Patent No.: US 11,062,648 B2
(45) Date of Patent: Jul. 13, 2021

(54) DISPLAY DEVICE AND METHOD OF SENSING THE SAME

(71) Applicant: NOVATEK Microelectronics Corp., Hsin-Chu (TW)

(72) Inventor: Chun-Chi Chang, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/409,877

(22) Filed: May 13, 2019

(65) Prior Publication Data

US 2020/0365080 A1 Nov. 19, 2020

(51) Int. Cl.
*G09G 3/32* (2016.01)
*G09G 3/3225* (2016.01)
*H01L 27/32* (2006.01)

(52) U.S. Cl.
CPC ....... *G09G 3/3225* (2013.01); *H01L 27/3244* (2013.01); *G09G 2320/0693* (2013.01)

(58) Field of Classification Search
CPC .......... G09G 2320/0693; G09G 3/3225; H01L 27/3244
USPC ............................ 345/58, 200–215, 690–691
See application file for complete search history.

(56) References Cited

U.S. PATENT DOCUMENTS

| | | | | |
|---|---|---|---|---|
| 2011/0169798 A1* | 7/2011 | Lee | ...................... | G09G 3/3233 345/211 |
| 2011/0227505 A1* | 9/2011 | Park | ...................... | H05B 45/60 315/297 |
| 2011/0279436 A1* | 11/2011 | Komiya | ............... | G09G 3/3233 345/212 |
| 2011/0298836 A1* | 12/2011 | Komiya | ............... | G09G 3/3233 345/690 |
| 2012/0019569 A1* | 1/2012 | Byun | ................... | G09G 3/3233 345/690 |
| 2013/0050292 A1* | 2/2013 | Mizukoshi | ........... | G09G 3/3291 345/690 |
| 2013/0257831 A1* | 10/2013 | Kim | ...................... | G09G 3/3233 345/205 |
| 2014/0152705 A1* | 6/2014 | Kwon | ................. | G09G 3/2003 345/690 |
| 2014/0176516 A1* | 6/2014 | Kim | ...................... | G09G 3/3233 345/204 |
| 2014/0176622 A1* | 6/2014 | Jung | ..................... | G09G 3/3208 345/690 |
| 2014/0368489 A1* | 12/2014 | Pak | ...................... | G09G 3/3233 345/212 |
| 2015/0154913 A1* | 6/2015 | Kim | ...................... | G09G 3/3233 345/691 |
| 2015/0161940 A1* | 6/2015 | Woo | ....................... | G09G 3/003 345/58 |
| 2015/0187268 A1* | 7/2015 | Tani | .................... | G09G 3/3233 345/77 |

(Continued)

*Primary Examiner* — Tony O Davis
(74) *Attorney, Agent, or Firm* — Winston Hsu

(57) ABSTRACT

A display device includes M sets of light emitters and (M+1) sets of drivers, wherein M is a positive integer. Each set of the (M+1) sets of drivers is coupled to at least one set of the M sets of light emitters. When a first set of drivers among the (M+1) sets of drivers are configured to perform a sensing operation, M sets of drivers other than the first set of drivers among the (M+1) sets of drivers are configured to drive the M sets of light emitters, respectively.

18 Claims, 7 Drawing Sheets

(56) References Cited

U.S. PATENT DOCUMENTS

| | | | |
|---|---|---|---|
| 2016/0012798 A1* | 1/2016 | Oh | G09G 3/325 |
| | | | 345/205 |
| 2016/0042690 A1* | 2/2016 | Chang | G09G 3/3258 |
| | | | 345/212 |
| 2016/0071445 A1* | 3/2016 | Kim | G09G 3/006 |
| | | | 345/212 |
| 2016/0098961 A1* | 4/2016 | Han | G09G 3/3291 |
| | | | 345/691 |
| 2016/0240144 A1* | 8/2016 | Song | G09G 3/3233 |
| 2016/0351096 A1* | 12/2016 | Tani | G09G 3/3233 |
| 2017/0004776 A1* | 1/2017 | Park | G09G 3/3208 |
| 2017/0032736 A1* | 2/2017 | Gu | G09G 3/3208 |
| 2017/0038898 A1* | 2/2017 | Kim | G09G 3/3233 |
| 2017/0039952 A1* | 2/2017 | Kim | G09G 3/3233 |
| 2017/0287390 A1* | 10/2017 | Lee | G09G 3/3233 |
| 2017/0294159 A1* | 10/2017 | Lee | H01L 27/3248 |
| 2017/0345376 A1* | 11/2017 | Tani | G09G 3/3266 |
| 2018/0018915 A1* | 1/2018 | Kim | G09G 3/3233 |
| 2018/0108721 A1* | 4/2018 | Lee | G09G 3/3233 |
| 2018/0114492 A1* | 4/2018 | Kim | G09G 3/3291 |
| 2018/0114815 A1* | 4/2018 | Lee | H01L 27/3244 |
| 2019/0114970 A1* | 4/2019 | Moradi | G09G 3/3291 |
| 2020/0388220 A1* | 12/2020 | Xu | G09G 3/3291 |

* cited by examiner

DISPLAY DEVICE AND METHOD OF SENSING THE SAME

BACKGROUND OF THE INVENTION

1. Field of the Invention

The present invention relates to a display device and its sensing method, and more particularly, to a display device with a parameter to be calibrated by sensing the information of the parameter.

2. Description of the Prior Art

An organic light-emitting diode (OLED) is a light-emitting diode (LED) in which the emissive electroluminescent layer is a film of organic compound, where the organic compound can emit light in response to an electric current. OLEDs are widely used in display panels of electronic devices such as television screens, computer monitors, and portable systems such as mobile phones, handheld game consoles and personal digital assistants (PDAs). An active matrix OLED (AMOLED), which is driven by a thin-film transistor (TFT) which contains a storage capacitor that maintains the pixel states to enable large size and large resolution displays, becomes the mainstream of the OLED displays.

After a long-time operation of an OLED panel, several parameters in the OLED panel, such as the threshold voltage of the TFT, may undergo degradations or variations with different extents through different pixels. In order to improve the uniformity of the OLED panel, the variations of these parameters need to be compensated, and the characteristics of the parameters should be sensed in order to determine the compensation degree for each pixel cell. In the conventional compensation method of an OLED panel, when the parameters are sent for compensation, light cannot be emitted and the display function should be disabled. Therefore, the sensing operation may be performed only when the OLED does not display, e.g., during the boot time before display operation starts. In other words, the sensing operation is not feasible during display time.

Nowadays, there are more and more applications of long time display such as a digital signage with commercial usage, a marquee and an advertisement billboard, wherein the display function is always on. Such an OLED panel may not perform the sensing operation during a long period of display time. Thus, there is a need for improvement over the prior art.

SUMMARY OF THE INVENTION

It is therefore an objective of the present invention to provide a novel method of sensing the parameters in the display device which may be performed during the display time, in order to solve the above problems.

An embodiment of the present invention discloses a display device, which comprises M sets of light emitters and (M+1) sets of drivers, wherein M is a positive integer. Each set of the (M+1) sets of drivers is coupled to at least one set of the M sets of light emitters. When a first set of drivers among the (M+1) sets of drivers are configured to perform a sensing operation, M sets of drivers other than the first set of drivers among the (M+1) sets of drivers are configured to drive the M sets of light emitters, respectively.

Another embodiment of the present invention discloses a method of sensing a display device, wherein the display device comprises M sets of light emitters and (M+1) sets of drivers. The method comprises configuring a first set of drivers among the (M+1) sets of drivers to perform a sensing operation; and configuring M sets of drivers other than the first set of drivers among the (M+1) sets of drivers to drive the M sets of light emitters, respectively, when the first set of drivers are configured to perform the sensing operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
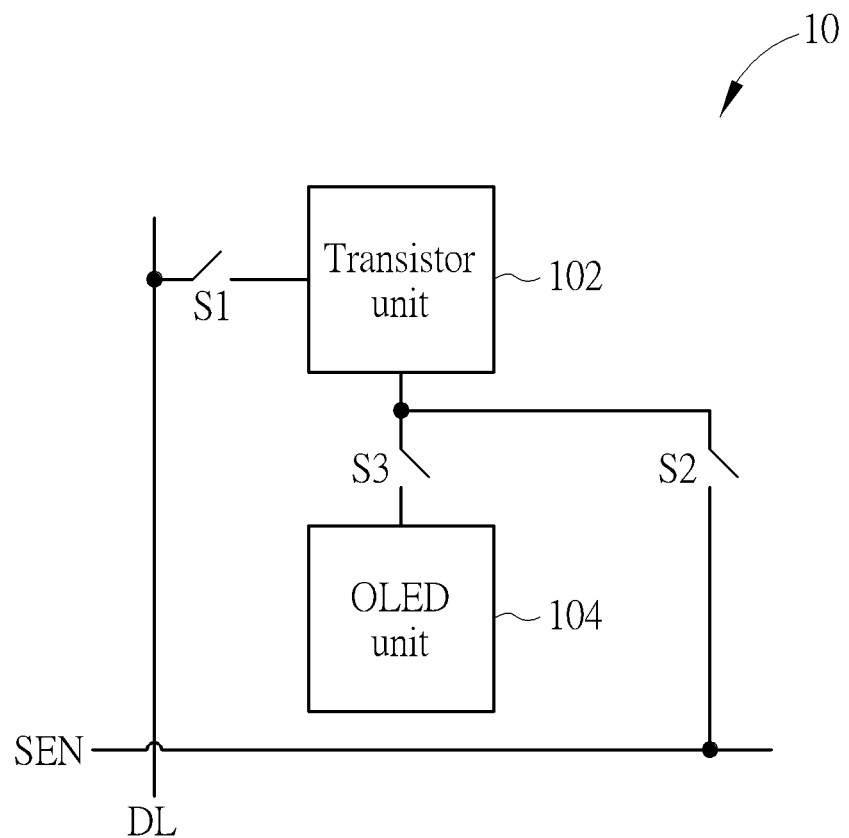
FIG. 1 is a schematic diagram of a pixel cell of a general display device.

Please refer to FIG. 1, which is a schematic diagram of a pixel cell 10 of a general display device such as an organic light-emitting diode (OLED) device. As shown in FIG. 1, the pixel cell 10 may be considered as a subpixel of a panel, and includes a transistor unit 102, an OLED unit 104 and switches S1-S3. The OLED unit 104 includes an OLED capable of emitting light. The transistor unit 102 includes a thin-film transistor (TFT), which may output currents to drive the OLED unit 104. The switches S1-S3 respectively control the operations of the transistor unit 102 and the OLED unit 104. In detail, the switch S1 is coupled between the transistor unit 102 and a data line DL, the switch S2 is coupled between the transistor unit 102 and a sensing line SEN, and the switch S3 is coupled between the transistor unit 102 and the OLED unit 104.

During a display time, the switches S1 and S3 are turned on and the switch S2 is turned off. A display data voltage is transmitted to the transistor unit 102 through the data line DL. The data voltage may control the TFT of the transistor unit 102 to output a specific current to the OLED unit 104. The OLED unit 104, receiving the current from the transistor unit 102, may emit light of which the brightness is controlled by the magnitude of the received current.

Figure 2:
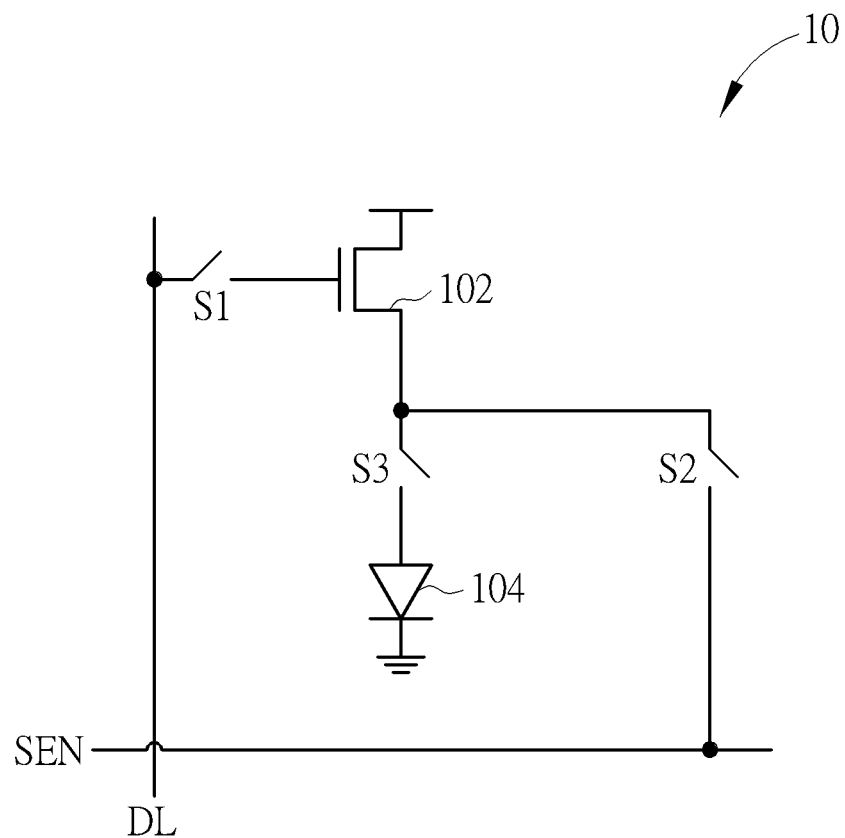
FIG. 2 is a schematic diagram of an exemplary implementation of the pixel cell shown in FIG. 1.

During a sensing time, the switches S1 and S2 are turned on and the switch S3 is turned off, where the TFT of the transistor unit 102 is sensed in order to calibrate the threshold voltage of the TFT. More specifically, a preconfigured programming voltage is transmitted to the transistor unit 102 through the data line DL. Based on the programming voltage, the transistor unit 102 may generate a sensing signal and the sensing signal is outputted through the sensing signal SEN. FIG. 2 illustrates an exemplary implementation of the pixel cell 10 shown in FIG. 1, wherein the transistor unit 102 is implemented as a TFT and the OLED unit 104 is implemented as an OLED. In order to sense the threshold voltage of the transistor unit 102, the programming voltage is forwarded to the gate terminal of the TFT. The switch S3 is turned off and thus no steady state current will flow through the TFT. In such a situation, the gate-to-source voltage of the TFT may be substantially equal to the threshold voltage of the TFT without current flowing through the TFT based on the MOSFET equation. The threshold voltage of the TFT may be obtained by sensing the source voltage of the TFT through the sensing line SEN. Therefore, during the sensing time, the switch S3 should be turned off, in order to prevent the OLED from drawing currents from the TFT to influence the sensing result. At this moment, the display function should be disabled since the switch S3 coupled to the OLED unit 104 is turned off.

Figure 3:
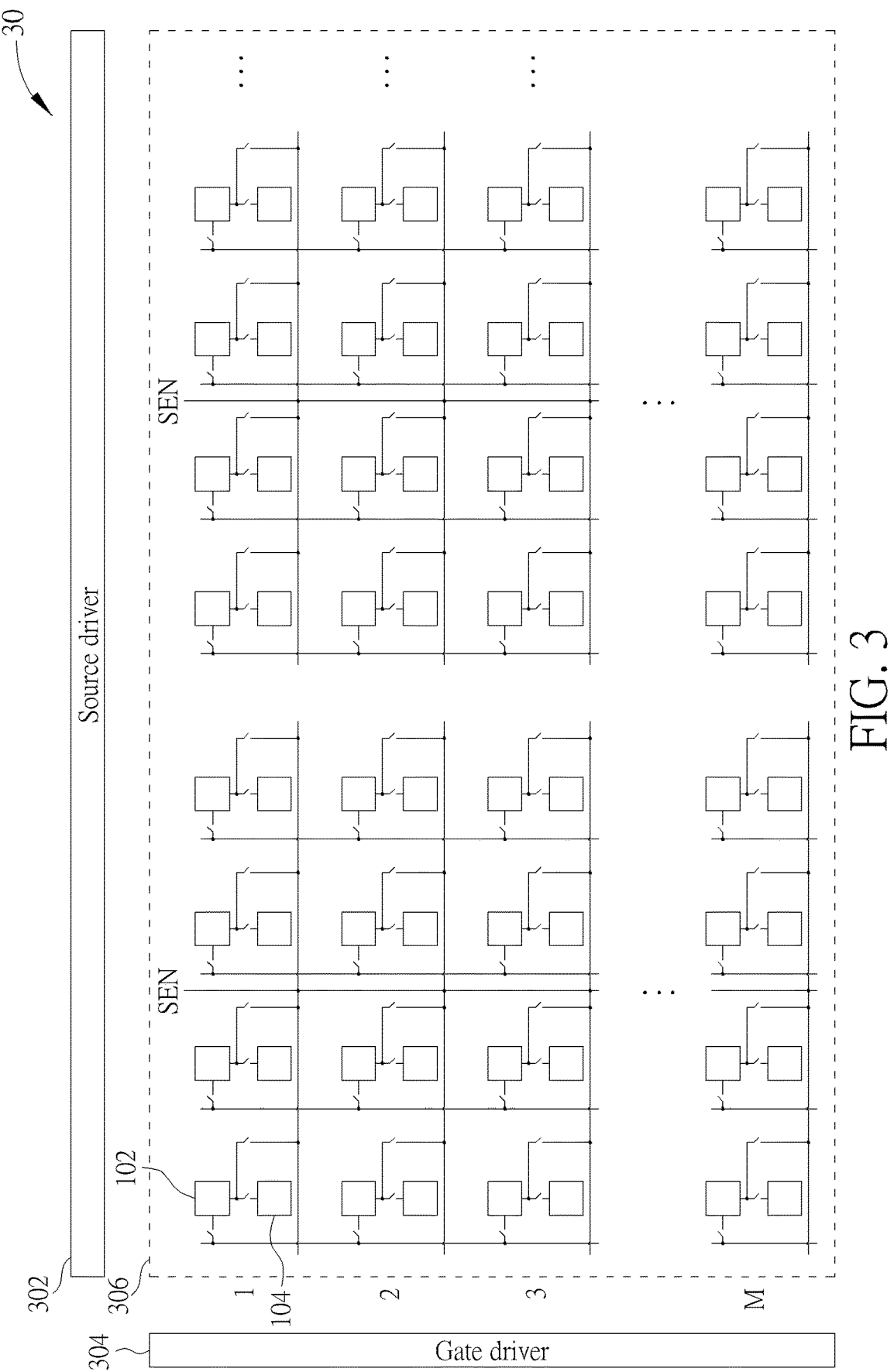
FIG. 3 is a schematic diagram of a general display device.

Please refer to FIG. 3, which is a schematic diagram of a general display device 30. The display device 30 includes a source driver 302, a gate driver 304 and an OLED panel 306. The OLED panel 306 includes a plurality of pixel cells having a structure identical to the pixel cell 10 shown in FIG. 1. The OLED panel 306 includes M rows of pixel cells, and display data are updated row by row to display desired images. If the OLED panel 306 is applied to long time display, the brightness uniformity of the OLED panel 306 may be reduced after a long period of time since the sensing operation cannot be performed during the display time.

Figure 4:
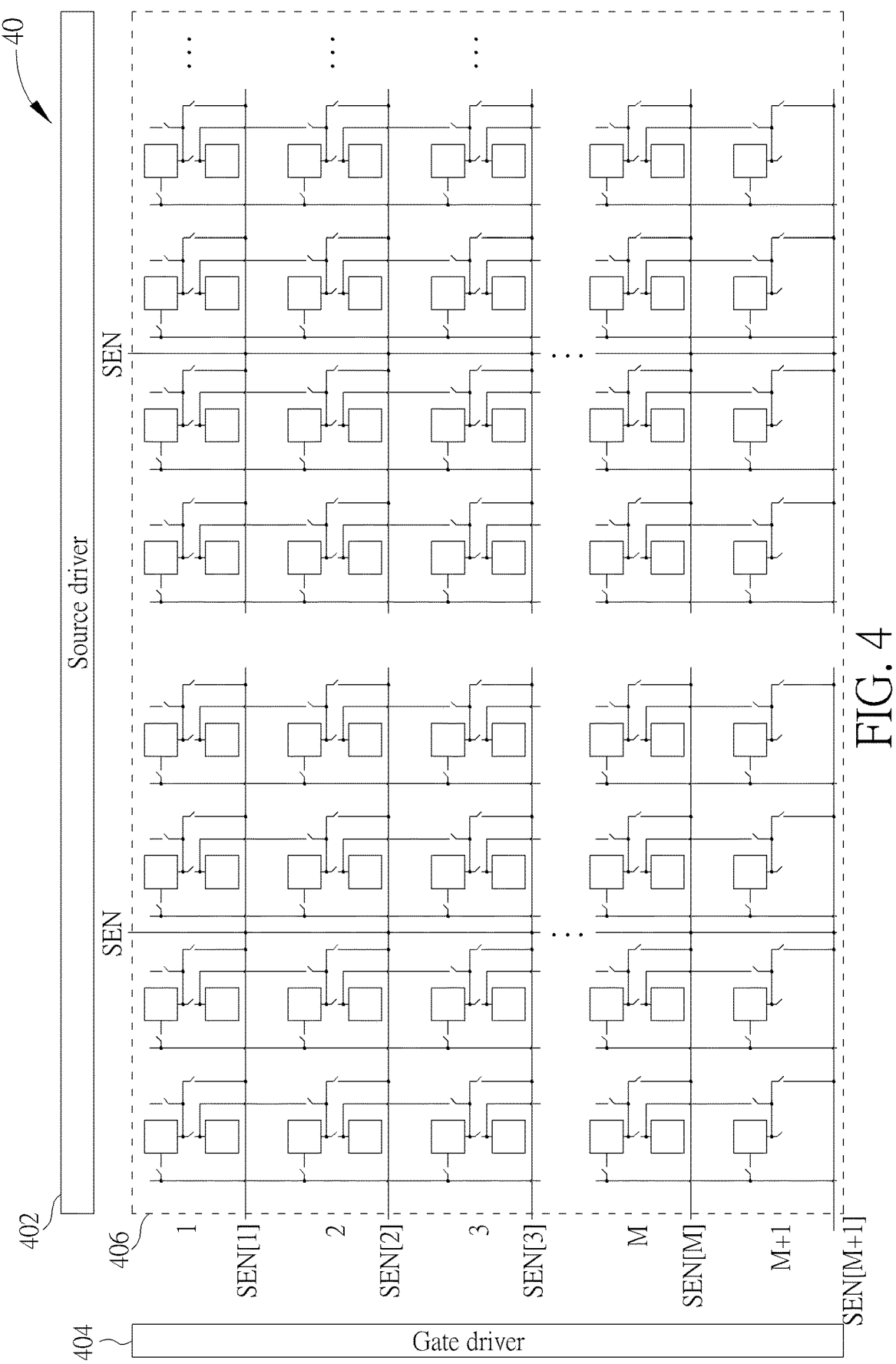
FIG. 4 is a schematic diagram of a display device according to an embodiment of the present invention.

Please refer to FIG. 4, which is a schematic diagram of a display device 40 according to an embodiment of the present invention. The display device 40 includes a source driver 402, a gate driver 404 and a display panel 406. The source driver 402 is configured to transmit display data to the display panel 406, allowing desired images to be shown on the display panel 406. In an embodiment, the source driver 402 may further include a sensing module, for receiving parameters from the sensing line of the display panel 406 in order to obtain information related to image calibration or compensation. Alternatively, the sensing module may be disposed uniquely in the display device 40. The gate driver 404 is configured to transmit scan signals to the display panel 406, and the scan signals turn on corresponding transistors to pass through the display data. The detailed implementations and operations of the source driver 402 and the gate driver 404 are well known by those skilled in the art, and will be omitted herein. The display panel 406 includes a plurality of pixel cells arranged as an array. More specifically, the display panel 406 includes (M+1) rows of pixel cells, wherein M is a positive integer. Each pixel cell of the $1^{st}$ to the $M^{th}$ rows of pixel cells includes a transistor unit and an OLED unit. Also, an additional row of pixel cells is disposed (i.e., the $(M+1)^{th}$ row), where each pixel cell includes a transistor unit only. Each pixel cell in the display panel 406 includes 4 switches, and this is different from the display panel 306 where each pixel cell only includes 3 switches. The implementations of the switches of the pixel cell allow each row of transistor units to be coupled to the corresponding OLED units in the same row and also coupled to the corresponding OLED units in the previous row.

In detail, each of the OLED units acts as a light emitter that is capable of emitting light with a desired brightness based on the magnitude of current flowing through the OLED unit, so as to generate a desired image on the display panel 406. Each of the transistor units acts as a driver for driving the corresponding OLED unit to generate the desired brightness by transmitting the current to the OLED unit. In an embodiment, each transistor unit includes a driving transistor such as a TFT, and the threshold voltage of the TFT needs to be calibrated to enhance the brightness uniformity of the display panel 406.

According to the arrangement shown in FIG. 4, the display panel 406 totally includes M rows of OLED units and (M+1) rows of transistor units. Among the (M+1) rows of transistor units, M rows of transistor units may be configured to drive the M rows of OLED units to emit light, respectively, while the other one row of transistor units is configured to perform a sensing operation, to sense the information of the parameter in the transistor units, so as to calibrate the parameter. As a result, with the additional row of transistor units, the sensing operation may be performed during the display time of the display device 40.

More specifically, when the $1^{st}$ row of transistor units are configured to perform the sensing operation, the $2^{nd}$ row to the $(M+1)^{th}$ row of transistor units are configured to drive the $1^{st}$ row to the $M^{th}$ row of OLED units, respectively. That is, each row of transistor units except the $1^{st}$ row drive the OLED units in its previous row. When the $2^{nd}$ row of transistor units are configured to perform the sensing operation, the $1^{st}$ row of transistor units are configured to drive the $1^{st}$ row of OLED units, and each row from the $3^{rd}$ row to the $(M+1)^{th}$ row of transistor units are configured to drive the OLED units in its previous row. By the same token, when the $M^{th}$ row of transistor units are configured to perform the sensing operation (where 1<m<M), each row from the $1^{st}$ row to the $(m-1)^{th}$ row of transistor units are configured to drive the OLED units in the same row, and each row from the $(m+1)^{th}$ row to the $(M+1)^{th}$ row of transistor units are configured to drive the OLED units in its previous row. Finally, when the $M^{th}$ row of transistor units are configured to perform the sensing operation, each row from the $1^{st}$ row to the $M^{th}$ row of transistor units are configured to drive the $1^{st}$ row to the $M^{th}$ row of OLED units, respectively. As a result, during the display time of the display device 40, there are always M rows of transistor units driving the M rows of OLED units, and the other one row of transistor units may be sensed for parameter calibration. Therefore, each row of transistor units may be sensed in turn during the display time.

Figure 5:
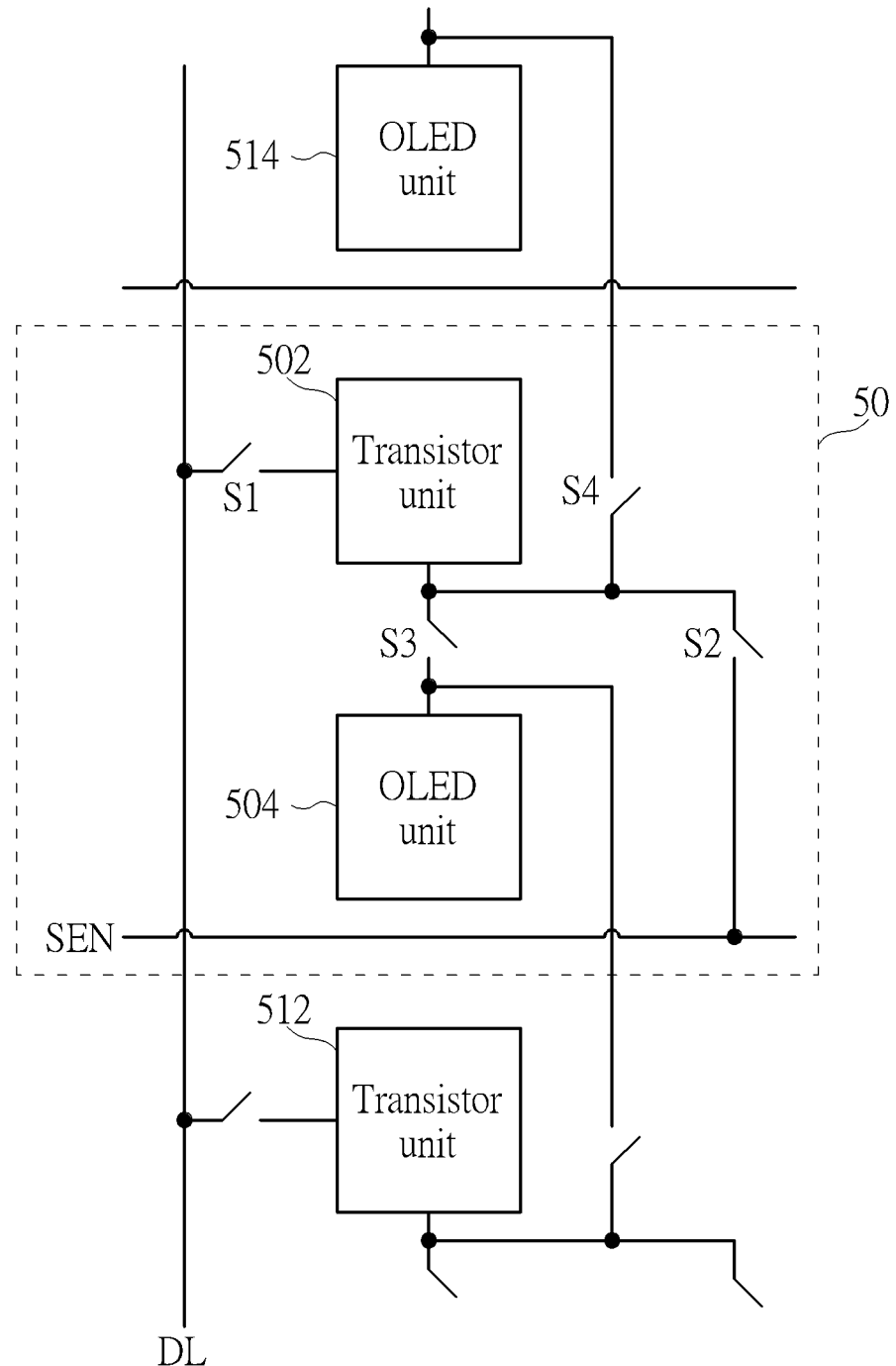
FIG. 5 is a schematic diagram of a detailed implementation of a pixel cell in the display panel.

FIG. 5 illustrates a detailed implementation of a pixel cell 50 in the display panel 406. The pixel cell 50 includes a transistor unit 502, an OLED unit 504 and switches S1-S4. A transistor unit 512 in the next row of pixel cell and an OLED unit 514 in the previous row of pixel cell are also shown in FIG. 5 to facilitate the description. In comparison with the general pixel cell 10 shown in FIG. 1, the pixel cell 50 includes one more switch S4. The switch S4 allows the transistor unit 502 to be coupled to the OLED unit 514 in the previous row, while the transistor unit 502 is coupled to the OLED unit 504 via the switch S3.

When a row of transistor units previous to the pixel cell 50 are sensed, the transistor unit 502 in the pixel cell 50 may be configured to drive the OLED unit 514 in the previous row of pixel cell. At this moment, the switch S4 is turned on and the switch S3 is turned off. Also, the OLED unit 504 in the pixel cell 50 is driven by the transistor unit 512 in the next row of pixel cell. When a row of transistor units next to the pixel cell 50 are sensed, the transistor unit 502 in the pixel cell 50 may be configured to drive the OLED unit 504 in the same pixel cell. At this moment, the switch S3 is turned on and the switch S4 is turned off. When the row of pixel cells including the pixel cell 50 are sensed, the switches S3 and S4 are turned off and the switch S2 is turned on, so that the parameter such as the threshold voltage in the transistor unit 502 may be sensed via the switch S2 and the sensing line SEN.

Therefore, in the display panel 406 shown in FIG. 4, the first row of transistor units may be configured to drive the OLED units in the same pixel cell, and the last row of transistor units (i.e., the additional (M+1) row) may be configured to drive the corresponding OLED units in the previous row of pixel cells. As for other rows of transistor units, they may be configured to drive the OLED units in the same row or the OLED units in the previous row based on the configurations of the switches and based on the sensing operation performed on which row. During the display time, the row of transistor units currently not configured to drive the OLED units may be sensed for calibration. In such a situation, each row of transistor units may be sensed by turns, allowing the display device of the present invention to be applicable to long time display.

As mentioned above, the first row of transistor units are merely configured to drive the OLED units in the same pixel cell, and the last row of transistor units are merely configured to drive the OLED units in the previous row. In such a situation, the switch S3 in the last row of pixel cells and the switch S4 in the first row of pixel cells may be omitted without affecting the driving functions of the transistor units. Preferably, these switches may be disposed to let all of the pixel cells in the display panel to have identical disposition of transistors and switches; hence, the aperture ratio of each pixel cell will be identical, so as to enhance the uniformity of the displayed brightness.

Figure 6:
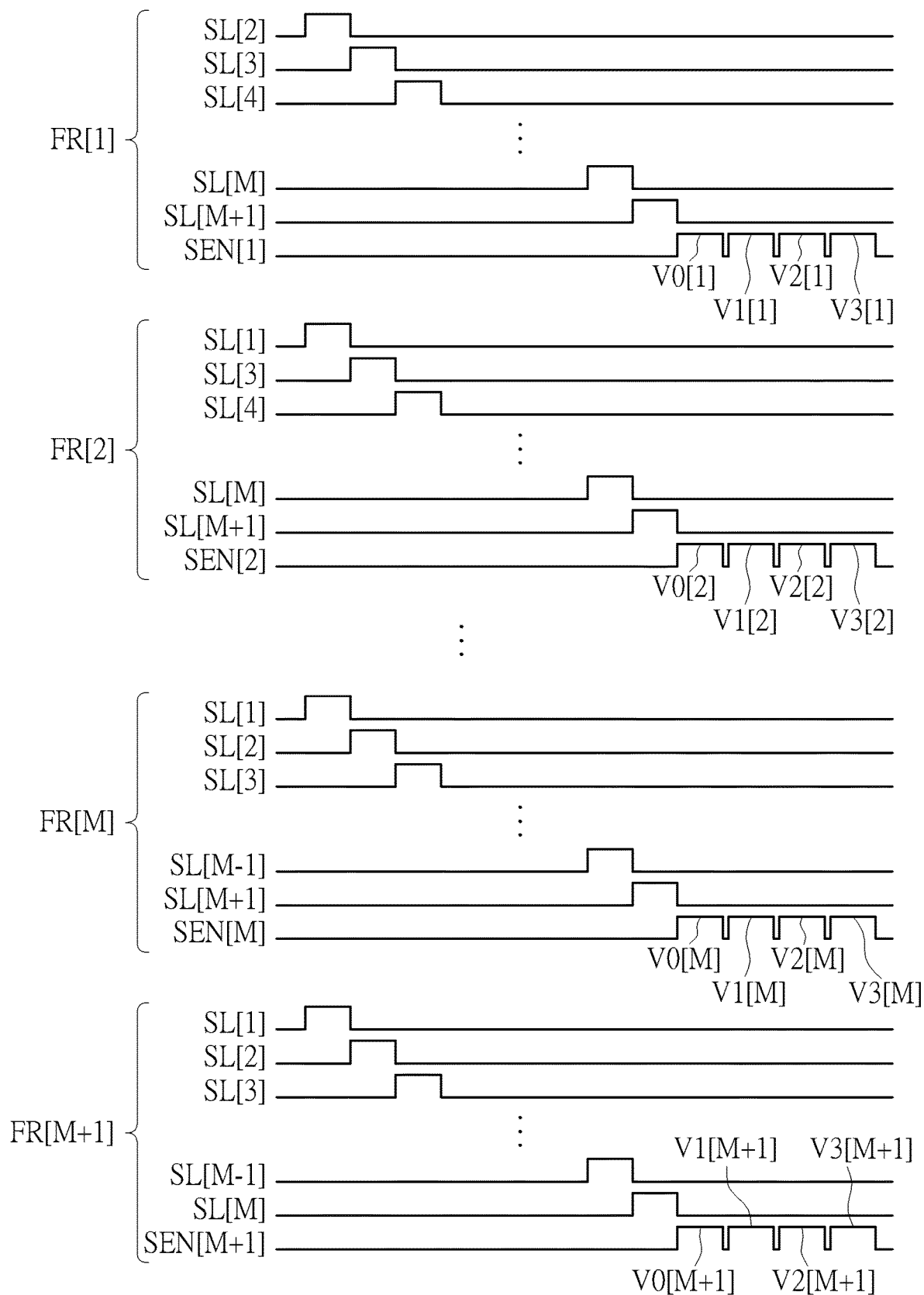
FIG. 6 is a waveform diagram of signals of a display panel according to an embodiment of the present invention.

Please refer to FIG. 6, which is a waveform diagram of signals of a display panel according to an embodiment of the present invention. In this embodiment, every 4 adjacent transistor units in the same row are classified as a group to share the same sensing line, as the implementation in the display panel 406. As shown in FIG. 6, the sensing operation is performed by receiving sensing signals from the 4 transistor units by turns in a blanking interval of the display device, where the blanking interval is the period after display data of a frame image are completely transmitted and before display data of the next frame image start to be transmitted.

In detail, during the display time, the transistor units are turned on via scan lines SL [1]-SL [M+1] row by row. For the first frame FR [1], the $1^{st}$ to the $M^{th}$ rows of OLED units are driven by the $2^{nd}$ to the $(M+1)^{th}$ rows of transistor units, and the $1^{st}$ row of transistor units are sensed. Therefore, the scan lines SL [2]-SL [M+1] transmit scan signals by turns, allowing the transistor units to receive display data of the frame FR[1]. After the display data and scan signals for the frame FR [1] are completely transmitted, the $1^{st}$ row of transistor units start to perform the sensing operation, where the sensing signals V0 [1]-V3 [1] for 4 transistor units may be received by a sensing module via the sensing line SEN [1] with time division (also see FIG. 4). Note that there may be a large number of sensing lines coupled to the $1^{st}$ row of transistor units, and only the sensing line SEN [1] is illustrated in FIG. 6 to facilitate the description. For example, if there are N columns of pixel cells in a display panel and thus each row of pixel cells have N transistor units, there may be N/4 sensing lines transmitting sensing signals if 4 transistor units share the same sensing line.

Similarly, in each of the frames FR [2]-FR [M+1] and the blanking interval thereafter, M rows of transistor units are turned on for receiving display data by turns, and the other row of transistor units perform the sensing operation. The 4 transistor units sharing the same sensing lines may be sensed one by one with time division in the blanking interval. The detailed operations are similar to those described in the above paragraphs, and will be omitted herein.

In general, during the display time, the display data should keep at the transistor units, e.g., keep at the gate terminal of the TFT where a capacitor is disposed for maintaining the voltage, before a new display data for the same pixel cell arrives. Therefore, the OLED may emit the desired brightness corresponding to the display data. Since the sensing operation should not affect the light emission of the OLED, if a transistor unit which is driving an OLED unit needs to be sensed, the OLED should be immediately switched to be driven by another transistor unit when the original transistor unit is switched to perform the sensing operation. After the sensing signal is received, the sensing signal may be stored in a lookup table which records information of calibration or compensation for subsequent display operations.

Please note that the present invention aims at providing a method of sensing parameters for calibration during the display time and a related display device. Those skilled in the art may make modifications and alternations accordingly. For example, the structure of the display panel 406 shown in FIG. 4 is one of various embodiments of the present invention. In another embodiment, the additional row of pixel cells including only the transistor cells may be disposed in other manners, e.g., disposed above the original $1^{st}$ row of pixel cells, and the transistor units in each row may be coupled to the corresponding OLED units in the next row. Also, in the above embodiments, 4 transistor units are grouped together and share the same sensing line; while in another embodiment, the transistor units may be grouped in other manners. For example, 3 transistor units may share the same sensing line in the situation where 3 RGB subpixels form a pixel in the display panel. In another embodiment, each transistor unit in a row may be coupled to a distinct sensing line, so that the sensing operation of a row of transistor units may be performed simultaneously. In addition, in the above embodiments, the pixel cells are scanned row by row for image display and the sensing operation is performed for a row of transistor units currently not configured to drive OLED units. In another embodiment, the scan operation for image display and the sensing operation for calibration may be performed column by column or performed in other order or manner. In other words, a display device may include M sets of OLED units and (M+1) sets of transistor units, and each set may be grouped in any appropriate manner, which should not be limited herein. Further, the present invention is applicable to any type of display device. For example, the display panel may be composed of another type of light emitter other than the OLED, and the transistor unit may be implemented as a corresponding driver for the light emitter.

Figure 7:
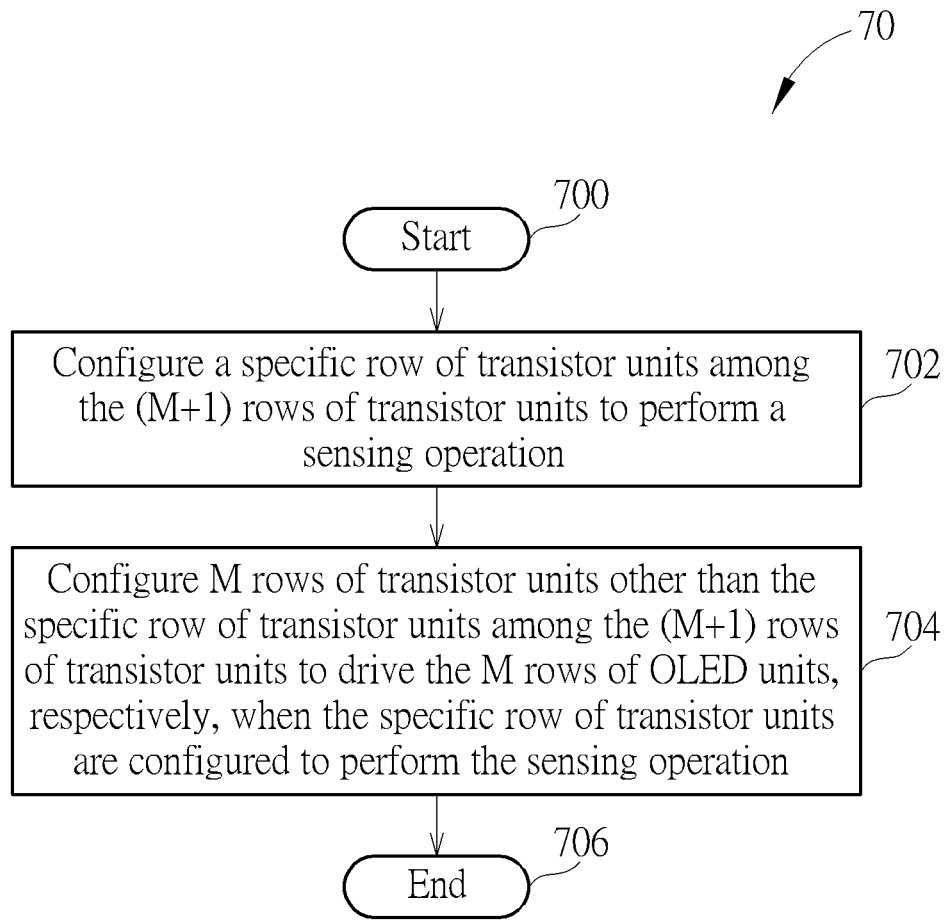
FIG. 7 is a schematic diagram of a sensing process according to an embodiment of the present invention.

The abovementioned method of sensing the display panel during the display time may be summarized into a sensing process 70, as shown in FIG. 7. The sensing process 70, which may be applied to a display device such as the display device 40 shown in FIG. 4 where the display device 40 includes M rows of OLED units and (M+1) rows of transistor units, includes the following steps:

Step 700: Start.

Step 702: Configure a specific row of transistor units among the (M+1) rows of transistor units to perform a sensing operation.

Step 704: Configure M rows of transistor units other than the specific row of transistor units among the (M+1) rows of transistor units to drive the M rows of OLED units, respectively, when the specific row of transistor units are configured to perform the sensing operation.

Step 706: End.

The detailed operations and alternations of the sensing process 70 are described in the above paragraphs, and will not be narrated herein.

To sum up, in the present invention, the display panel includes one more row of transistor units, e.g., there are M rows of OLED units and (M+1) rows of transistor units. Among the (M+1) rows of transistor units, M rows are configured to drive the M rows of OLED units, respectively, and another row of transistor units are configured to perform the sensing operation. In each pixel cell of the display panel, an additional switch is disposed to couple the transistor units in each row to the OLED units in the previous row, allowing the transistor units to drive the corresponding OLED units in the previous row if necessary. Therefore, the sensing operation for calibration or compensation may be performed during the display time. This facilitates the application of long time display such as a digital signage with commercial usage, a marquee and an advertisement billboard.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display device, comprising:
M sets of light emitters, wherein M is a positive integer; and
(M+1) sets of transistor units, each set of transistor units coupled to at least one set of the M sets of light emitters;
wherein at a time when a first set of transistor units among the (M+1) sets of transistor units perform a sensing operation, M sets of transistor units other than the first set of transistor units among the (M+1) sets of transistor units drive the M sets of light emitters to emit light, respectively.

2. The display device of claim 1, wherein the sensing operation is performed for calibrating a parameter in the (M+1) sets of transistor units.

3. The display device of claim 1, wherein each of the M sets of light emitters comprises an organic light emitting diode (OLED).

4. The display device of claim 1, wherein each of the (M+1) sets of transistor units comprises a driving transistor, and the sensing operation is performed for calibrating a threshold voltage of the driving transistor.

5. The display device of claim 1, further comprising a plurality of switches, wherein a first transistor unit among the (M+1) sets of transistor units is coupled to a first light emitter among the M sets of light emitters via a first switch among the plurality of switches, and coupled to a second light emitter among the M sets of light emitters via a second switch among the plurality of switches.

6. The display device of claim 5, wherein the first transistor unit is configured to drive the first light emitter when the first switch is turned on and the second switch is turned off, and configured to drive the second light emitter when the second switch is turned on and the first switch is turned off.

7. The display device of claim 1, wherein each set of light emitters among the M sets of light emitters comprise a row of light emitters, and each set of transistor units among the (M+1) sets of transistor units comprise a row of transistor units.

8. The display device of claim 1, wherein the sensing operation is performed during a display time of the display device.

9. The display device of claim 1, wherein the sensing operation is performed by receiving a sensing signal from at least one of the (M+1) sets of transistor units configured to perform the sensing operation in a blanking interval of the display device.

10. A method of sensing a display device, the display device comprising M sets of light emitters and (M+1) sets of transistor units, the method comprising:
configuring a first set of transistor units among the (M+1) sets of transistor units to perform a sensing operation; and
driving, by M sets of transistor units other than the first set of transistor units among the (M+1) sets of transistor units, the M sets of light emitters to emit light, respectively, at a time when the first set of transistor units perform the sensing operation.

11. The method of claim 10, wherein the sensing operation is performed for calibrating a parameter in the (M+1) sets of transistor units.

12. The method of claim 10, wherein each of the M sets of light emitters comprises an organic light emitting diode (OLED).

13. The method of claim 10, wherein each of the (M+1) sets of transistor units comprises a driving transistor, and the sensing operation is performed for calibrating a threshold voltage of the driving transistor.

14. The method of claim 10, wherein the display device further comprises a plurality of switches, wherein a first transistor unit among the (M+1) sets of transistor units is coupled to a first light emitter among the M sets of light emitters via a first switch among the plurality of switches, and coupled to a second light emitter among the M sets of light emitters via a second switch among the plurality of switches.

15. The method of claim 14, further comprising:
configuring the first transistor unit to drive the first light emitter when the first switch is turned on and the second switch is turned off; and
configuring the first transistor unit to drive the second light emitter when the second switch is turned on and the first switch is turned off.

16. The method of claim 10, wherein each set of light emitters among the M sets of light emitters comprise a row of light emitters, and each set of transistor units among the (M+1) sets of transistor units comprise a row of transistor units.

17. The method of claim 10, wherein the sensing operation is performed during a display time of the display device.

18. The method of claim 10, wherein the sensing operation is performed by receiving a sensing signal from at least one of the (M+1) sets of transistor units configured to perform the sensing operation in a blanking interval of the display device.

* * * * *